United States Patent [19]

Howard et al.

[11] 4,017,890
[45] Apr. 12, 1977

[54] INTERMETALLIC COMPOUND LAYER IN THIN FILMS FOR IMPROVED ELECTROMIGRATION RESISTANCE

[75] Inventors: James Kent Howard, Fishkill; Paul Siu-Chung Ho, Mahopac, both of N.Y.

[73] Assignee: International Business Machines Corporation, Armonk, N.Y.

[22] Filed: Oct. 24, 1975

[21] Appl. No.: 625,439

[52] U.S. Cl. .................................. 357/67; 357/65; 357/68; 357/71; 252/512; 75/139; 174/68.5
[51] Int. Cl.² .................. H01L 23/48; H01L 29/46; H01L 29/62; H01L 29/64
[58] Field of Search .................. 357/65, 67, 68, 69, 357/71; 252/512; 75/139; 174/68.5

[56] References Cited

UNITED STATES PATENTS

| 3,725,309 | 4/1973 | Ames et al. | 357/65 |
| 3,743,894 | 7/1973 | Hall et al. | 357/65 |

OTHER PUBLICATIONS

IBM Technical Disclosure Bulletin; by Daley et al. vol. 13, No. 6, Nov. 1970, p. 1735.
IBM Technical Disclosure Bulletin; by Ainslie et al., vol. 13 No. 7, Dec. 1970, pp. 2014 and 2015.
IBM Technical Disclosure Bulletin; vol. 13, No. 12, May 71, by Heurle et al., p. 3793.
IBM Technical Disclosure Bulletin; by Heller et al.; vol. 15, No. 1, June 72, pp. 348 and 349.

Primary Examiner—Andrew J. James
Attorney, Agent, or Firm—George O. Saile

[57] ABSTRACT

A method and resulting structure for forming narrow intermetallic stripes which will carry high currents on bodies such as semiconductors, integrated circuits, magnetic bubbles structures, etc. The conductive stripe includes aluminum or aluminum copper with at least one transition metal. The aluminum and at least one transition metal are deposited onto a supporting body at a very low pressure in a substantially oxygen-free high vacuum. The composite is then annealed at a temperature between about 200° C and 525° C for a time sufficient to form an aluminum and transition metal compound within the aluminum. The conductive stripes are then formed by masking and removing portions of the annealed metallic material. The resulting conductive stripes, which may be of a width of about $6 \times 10^{-4}$ inches or less, have a significantly improved electromigration performance without significantly increasing resistance in the conductive stripe.

17 Claims, 4 Drawing Figures

INTERMETALLIC COMPOUND LAYER IN THIN FILMS FOR IMPROVED ELECTROMIGRATION RESISTANCE

BACKGROUND OF THE INVENTION

The invention relates to methods and resulting devices for forming an aluminum conductive stripe having a region therein with an intermetallic compound of aluminum and a transition metal.

DESCRIPTION OF PRIOR ART

Thin, narrow conductive films or stripes have been used for some years for device interconnection purposes in the semiconductor and integrated circuit industry. Similar types of conductive stripes are used in the newly developing magnetic bubble memory devices. As these devices become smaller and smaller, the interconnecting stripes become smaller and smaller. An important material for the interconnection technology is aluminum. The constant push for higher component density and additional miniaturization has resulted in substantial current densities in some interconnections which are so high that a failure mechanism called electromigration has become a serious reliability problem.

The term electromigration refers to the current induced mass transport which occurs in a conductive material maintained at an elevated temperature and through which current is passed wherein atoms of conductor material are displaced as a result of the combined effects of direct momentum exchange from the moving electrons and the influence of the applied electric field. The current induced mass transport phenomena causes a partial removal of material under the influence of the electrical current from one or more locations in the conductor stripe to a build-up of material in other locations. The result can be an open circuit in the areas where the material is removed and a short circuit in the areas where a build-up material is effected. Also the protective ability of an overlaying passivation layer such as a glass, silicon nitride or silicon dioxide can be fractured as a result of the removal or build-up. This fracturing can cause failure due to atmospheric corrosion of the conductor stripes.

The nature of the electromigration problem was apparently first identified in a report by I. A. Blech et al., Rome Air Development Center, Griffits AFB New York, Technical Report TR66-31 (December, 1965) and in the article entitled "Failure of Thin Aluminum Current-Carrying Stripes on Oxidized Silicon" published in Physics of Failure in Electronics Vol. 5, pp. 496–505 (1967). Important solutions to the problem were taught in the Ainslie et al. U.S. Pat. No. 3,474,530 and I. Ames et al. U.S. Pat. No. 3,725,309, both of which are assigned to the present assignee.

The Ainslie Patent describes a method for forming the conductive stripe wherein the vapor deposition of the current carrying material includes the steps of providing a width and heighth minimum cross-sectional dimensional combination such that the current density is confined to a value less than 0.25 of the maximum tolerable current density and increasing the width and heighth dimension combination and adjusting the self-diffusion coefficient of the particular conductive material insitu interdependently within the relationship lifetime (current density) $-p$ self-diffusion coefficient $-1$, where $p$ is between 1 and 3 and the self-diffusion coefficient including an activation energy in excess of 0.3 electron volts.

The Ames et al. Patent extends the Ainslie patent in suggesting the significant advantage of additions of copper to the aluminum stripe within the range of 0.1 percent to 54 percent by weight copper. This addition had a substantial increase in the lifetime of conductive stripes due to its improved resistance to electromigration phenomena.

Other materials have been proposed to be added to aluminum for improvement in the electromigration resistance. H. J. Bhatt, Applied Physics Letters, 30–33, 1971, proposed the addition of aluminum trioxide ($Al_2O_3$). Gangulee et al. "Effective Alloy Additions on Electromigration Failures in Thin Aluminum Films", Applied Physics Letters 19, 76–77, 1971, and d'Heurle et al. "Effects of Complex Alloy Additions on Electromigration in Aluminum Thin Films" proceedings 10th Ann. Rel. Phys. Symp., Las Vegas, Nev., pp. 165–170, 1972, proposed the addition of magnesium, nickel and chromium.

Another proposed way for improving the electromigration resistance of aluminum has been through the use of boundary layers. This boundary layer of another material is typically either in contact with the top or the bottom surface of the aluminum film. A thin layer of titanium has been proposed and has been found to be beneficial by J. C. Anderson in "Application of Thin Films in Microelectronics", Thin Solid Films 12, 1–15 1972 and Patterson "Ti-Al Metallization for Multilayer Circuits", Electrochem. Soc. Fall Meeting 1972, Miami Beach, Fla., pages 633–634, 1972, "Titanium Overlay on Metallurgy", Gniewek et al., IBM TDB Vol. 13, No. 5, October 1970, pg. 1124. Oliver et al. "Theory of the Failure of Semiconductor Contacts by Electromigration" Proc. 8th Annual Reliability Phys. Symp. Las Vegas, Nev. pp. 116–120, 1970 found no significant difference whether a titanium layer was used or not.

U.S. Pat. No. 3,562,604 to K. J. B. Laer et al. entitled "Semiconductor Device Provided with an Insulating Layer of Silicon Oxide Supporting a Layer of Aluminum" issued Feb. 9, 1971 describes the use of a boundary layer of titanium on at least a portion of an aluminum layer and a second aluminum layer on the portion of the titanium layer. The layers are formed in the patent's example in a low vacuum in order of succession of aluminum, titanium and aluminum followed by a thermal treatment at approximately 550° C for 10 minutes. The purpose of the thermal treatment is not for annealing the aluminum and titanium but is for improving the ohmic connection to the subjacent silicon for the emitter, collector and base contacts.

Investigations by Agarwala et al. (J. Appl. Phys. 41, 3945 (1970) have shown that a serious reliability problem can exist when the conductor line width is decreased from $6 \times 10^{-4}$ inches to $2 \times 10^{-4}$ inches. It was observed that the median time for electromigration failure dropped by about a factor of 10 and the spread in failure times (standard deviation) increased by a factor of 3 or 4. Recent studies by Scoggan et al. (presented at 13th Annular Relliability Physics Symposium, Las Vegas, Nev., 1975) show a continued decrease in lifetime as the stripe width is decreased from $4 \times 10^{-4}$ inches to $5 \times 10^{-4}$ inches. It is proposed that as the stripe width approaches the grain size, the probability of an open stripe occuring is increased.

SUMMARY OF THE PRESENT INVENTION

In accordance with the present invention, improved electromigration performance for very narrow conductive lines can be achieved without significantly increasing conductive stripe resistance through proper fabrication of intermetallic layers in aluminum based films. The current carrying structure which has a minimum physical dimension of less than about $6 \times 10^{-4}$ and supported on a substrate includes aluminum and at least one region within the aluminum stripe containing an intermetallic compound of aluminum stripe containing an intermetallic compound of aluminum and a transition metal.

A method for fabricating these narrow intermetallic conductor stripes on the surface of a body involves first depositing aluminum and at least one transition metal over the body at a pressure of less than about $1 \times 10^{-5}$ torr in a substantially oxygen free vacuum. The structure is then annealed at a temperature between 200° C and 525° C for a time sufficient to form at least one region within the aluminum stripe of aluminum and a transition metal compound. The conductive metal stripes are then formed by masking and removing portions of the annealed metallic material such as by chemical etching or electron-beam lithography to define narrow lines.

DESCRIPTION OF THE PREFERRED EMBODIMENTS

Figure 1:
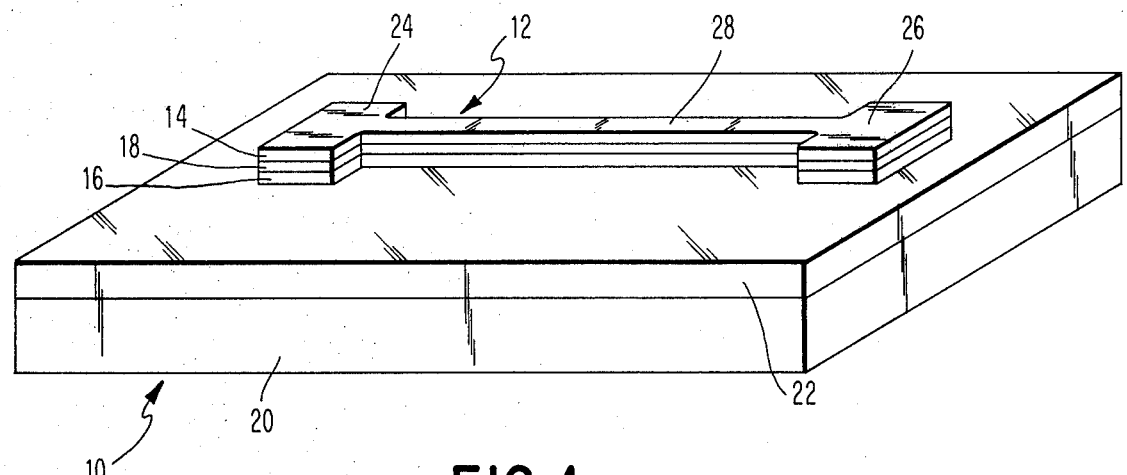
FIG. 1 is a perspective view which shows a current conductive stripe supported on a substrate.

FIG. 1 shows a structure of the present invention where a substrate or body 10 supports the aluminum conductive stripe 12 having physical dimensions of less than about $6 \times 10^{-4}$ inch. The aluminum stripe 12 is made up of substantially aluminum layers 14 and 16, preferably but not necessarily a layer of unreacted transition metal about one-fourth to one-fifth the original transition metal thickness, and an intermetallic compound region 18 of aluminum and a transition metal. The intermetallic compound is between about 2 and 40 percent by weight of the aluminum stripe 12. For example, 5% by weight corresponds to about 500 A $CrAl_7$ in 12,000 A and 25% by weight corresponds to about 3400 A of $CrAl_7$ in 12,000 A of aluminum. The intermetallic compound region is illustrated in FIG. 1 as near the center of the thickness of the conductive stripe which is one advantageous position for this compound. Another advantageous location for the intermetallic compound is located near the bottom of the thickness of the aluminum stripe 12. The substrate or body 10 upon which the aluminum stripe is supported on can be one of any desirable substrates which has use of such a very thin conductive stripe. One example is a semiconductor substrate having a plurality of transistor, diode, charge couple device, resistors, capacitors, or the like, devices therein. In this type of embodiment the substrate would be composed of a silicon base member 20 with a silicon dioxide coating 22 thereover. The metal stripe 12 having enlarged contact regions 24 and 26 with the very thin conductive stripe 28 therebetween is carried on the composite substrate 20, 22.

Another important application for very thin aluminum stripes such as illustrated in FIG. 1 is in the magnetic bubble type of structure. In this type of device, the base member 20 would be a garnet material, a metal oxide coating which could be silicon dioxide 22 is carried on the garnet body and the conductive stripe 12 would be formed thereover.

The total aluminum film 12 thickness in the test stripe configuration is between about 5000 Angstroms and 15,000 Angstroms. The conductive stripe 28 itself, not including the pad regions 24, 26, is for example between about 0.006 and 0.6 mils wide and 10.0 mils long or longer. The corners where the conductive stripe enter the land or pad areas 24 and 26 are rounded in order to minimize the possibility of failure modes associated with electromigration. The pad areas 24 and 26 are relatively large in comparison to the stripe. However, they are of the same thickness as the conductive stripe 28.

There are optimum trade-offs between the desirable electromigration lifetime and the resistivity in the conductive stripe. The greater the amount of transition metal within the aluminum stripe, the greater the resistivity.

Figure 2:
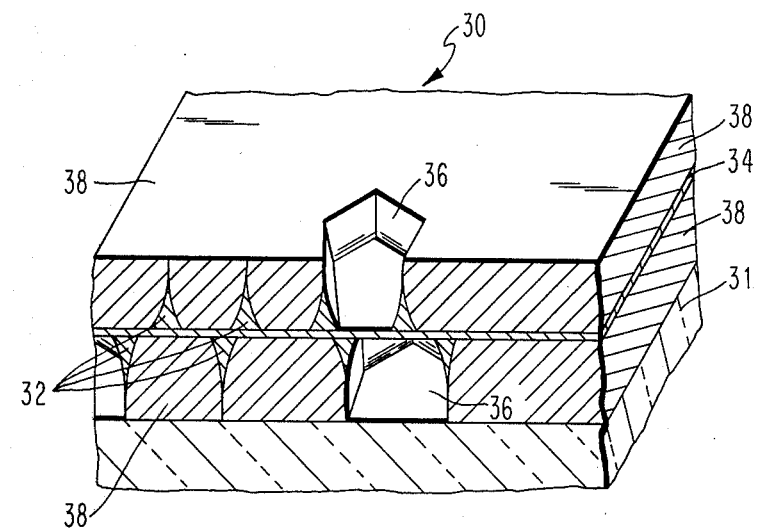
FIG. 2 is a greatly enlarged schematic cross-section of one embodiment of an aluminum stripe of the present invention.

FIG. 2 illustrates an aluminum conductive stripe 30 of the high stability type supported on a substrate 31. The high stability or high melting point aluminum-transition metal compounds, such as $HFAl_3$, have very low transition metal diffusion through the aluminum grains. There is, however, considerable diffusion through the grain boundaries which leads to preferential compound 32 formation at the grain boundaries. This results in a thinned layer 34 at the original transition metal location. Therefore the probability of link-up of voids 36 in the aluminum portions 8 of the stripe is enhanced because this original layer is thin. However, the high stability compound may be very efficient in reducing the aluminum flux through the grain boundaries because there is now compound between the grain boundaries.

Figure 3:
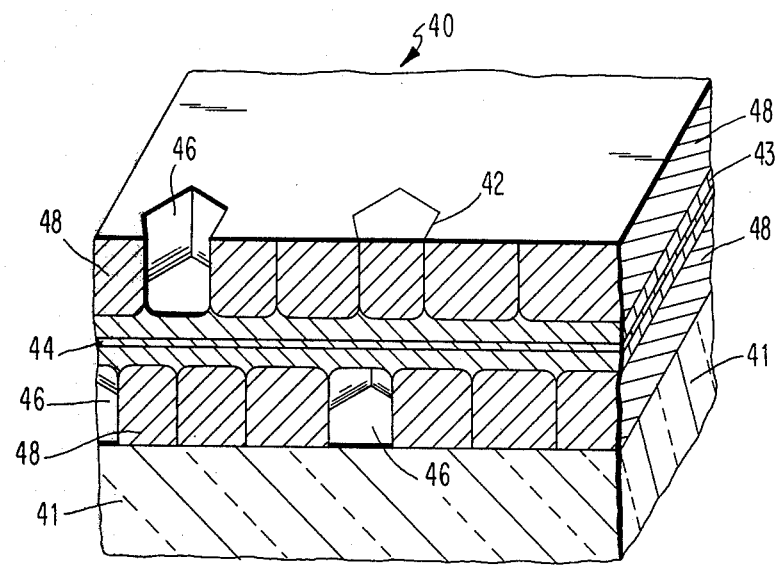
FIG. 3 is a greatly enlarged schematic cross-section of another aluminum stripe of the present invention.

Certain high stability aluminum transition metal intermetallic compounds such as $TiAl_3$, $ZrAl_3$, $HFAl_3$, $CbAl_3$ and $TaAl_3$ do not require as much initial metal to achieve good electromigration improvement, that is, at least ten times better than the average of aluminum — 6% copper lifetime for the same tests and line widths. The initial transition metal thickness for these metals is in the range of about 150–1000 Angstroms for a total aluminum tjickness of 15,000 Angstroms. For initial thicknesses of the transition metal less than 150 Angstroms there is not a significant improvement in the electromigration lifetime characteristics while above approximately 1000 Angstroms the resistivity of the conductive stripe is too high for most circuit applications. FIG. 3 shows an aluminum conductive stripe 40 of a low stability type supported on a substrate 41. The low stability or low melting compounds, such as $CrAl_7$ have fast diffusion through the grains and minimal diffusion through the grain boundaries 42 to form a rather continuous sheet of transition metal-aluminum compound 43. There is preferably but not necessarily an unreacted transition metal layer 44. This compound has the effect of reducing the aluminum electrotransport and it also has the effect of reducing the vacancy transport, i.e. voids 46 that start in the film are terminated at the compound interface. This structure is efficient in stopping the link-up of holes that start from the top and the bottom of the film since the compound layer is comparatively thick. Therefore even though the aluminum 48 is depleted by electromigration, the stripe is continuous and still carries current. The lifetime is thus enhanced for the compounds which form layered structures as compared with the transition metal-aluminum compounds, like $HfAl_3$, which form the intergranular type layers.

The lower stability compound such as $CrAl_7$, $PdAl_3$, $NiAl_3$, $PtAl_4$, $WAl_5$, $VAl_7$, $MoAl_5$ usually require from about 250 Angstroms to about 1200 to provide the optimum tradeoff between the electromigration improvement and satisfactory conductance of current in the stripe. The thickness of Al-transition metal combination required to form a desired compound can be calculated using the density valves of Al and the transition metal combined with information contained in the phase diagram. In the case of $CrAl_7$, we have found that a Cr thickness of 150–250 Angstroms does not lead to a significant electromigration improvement while above 800 A the resistivity is too high for circuit applications.

The Al transition metal structures with optimum electromigration properties are those that form well defined planar layer of intermetallic aluminum transition metal compound after annealing. The growth of the intermetallic follows a parabolic law (thickness $\alpha$ time)$^{1/2}$. The following compounds are the most valuable because the metal is commonly used in integrated circuit contacts, thus the addition of a metal layer in the stripe center for electromigration is simple.

| Compound | Melting Point | Stability Index I | Growth Kinetics |
| --- | --- | --- | --- |
| $PdAl_3$ | 1058° K | 91 | t½(parabolic) |
| $PtAl_4$ | 1079° K | 93 | t½(parabolic) |
| $CrAl_7$ | 1063° K | 97 | t½(parabolic) |
| $HfAl_3$ | 1673° K | 130 | t¼(non-para.) |
| $ZrAl_3$ | 1853° K | 150 | t¼(non-para.) |
| $CbAl_3$ | 1878° K | 135 | t¼(non-para.) |
| $TiAl_3$ | 1613° K | 134 | t½(parabolic) |
| $W Al_5$ | 1143° K | 82 | t½(parabolic) |
| $V_4Al_{23}$ | 1009° K | 90 | t½(parabolic) |
| $V Al_7$ | 973° K | 88 | t½(parabolic) |
| $TaAl_3$ | 1973° K | 130 | t¼(non-para.) |
| $Co_4Al_{13}$ | 1403° K | 119 | t½(parabolic) |
| $NiAl_3$ | 1127° K | 119 | t½(parabolic) |

Of the above low stability compounds such as $CrAl_7$ is the preferred layer because when properly located in the aluminum stripe they not only reduce the movement of Al by electromigration but also prevent the coalescence of holes (voids) in the Al, thus preventing stripe failure (FIG. 3). High stability compounds such as $HfAl_3$ and $TaAl_3$ appear to form preferentially at grain boundaries (FIG. 2), rather than in layers $CrAl_7$), and are effective in reducing Al movement but probably not as effective in preventing a hole from penetrating through the film. The retention of unreacted transition metal in the layered structure may be useful for extending stripe lifetime by converting into compound in the vicinity of holes. As the holes grow in size, the Joule heating increases thus locally converting the unreacted metal to compound and preventing stripe failure.

The location of the aluminum transition metal region or regions must be within the aluminum conductive stripe. This is because of the dual role of the intermetallic compound, i.e. reduction of aluminum electromigration (mass transport) and preventing holes in the top aluminum (or aluminum-copper) layer from joining holes in the bottom aluminum layer. Of the two effects, the elimination of continuous holes that traverse the stripe width is thought to be the most important in increasing the electromigration lifetime of narrow line conductor stripes. Should the transition metal layer be applied as a bottom layer, the structure is not an optimum one because there is no method to prevent voids that do form from penetrating the entire aluminum conductive stripe thereby causing opens and/or increase resistance in the stripe and less compound would be formed by annealing step. There could be an adverse effect on the ohmic contact to silicon and the aluminum film.

A top layer of aluminum-transition layer is not optimum because the compound layer is unable to prevent voids from penetrating the entire thickness of the conductor stripe and less compound would be formed by annealing step.

The preferred location of the aluminum-transition metal intermetallic compound region is near the center or the lower part of the conductive stripe. This type of structure increases the preferred orientation of at least one-half of the aluminum film, that is the film above the compound region, thus reducing the electromigration rate. The layer also provides a barrier for void propagation through the aluminum film. The thin intermetallic compound layer can be used to control resistivity while producing significantly improved lifetime of the conductive stripe.

Several intermetallic compound regions, in layer form, can be used within the conductive stripe. This produces the best electromigration prevention characteristics since the alumunim grown on the intermetallic layers have high preferred orientation usually <111> or <110>. Thus in this arrangement as much as two-thirds of the aluminum is ordered in preferred orientation. This is important because electromigration rate of aluminum decreases as orientation increases. The failure time is reduced because link-up is reduced by non-overlaying grain structures in the aluminum layers. The grain size is limited to thickness of each of the aluminum layers thus small grain size is maintained which produces sharp well defined stripe boundaries. However, the problems with having more than one metallic layer or region are that resistivities are increased due to more of the intermetallic compound being present in the stripe and the process of fabrication is somewhat more difficult.

Another structure having electromigration improvement involves the co-deposition of aluminum (or aluminum-copper) and transition metal to form the intermetallic compound. This is a technique which is easy to manufacture so long as a source of the transition metal and aluminum mixture is available for the evaporator process. The lifetime of the conductive stripe is not as good as the layered film, but is still at least ten times superior to the aluminum copper stripes of the prior art, because no barrier effect to avoid link-up is possible. Also care must be utilized to maintain the resistivity at a satisfactory level.

Figure 4:
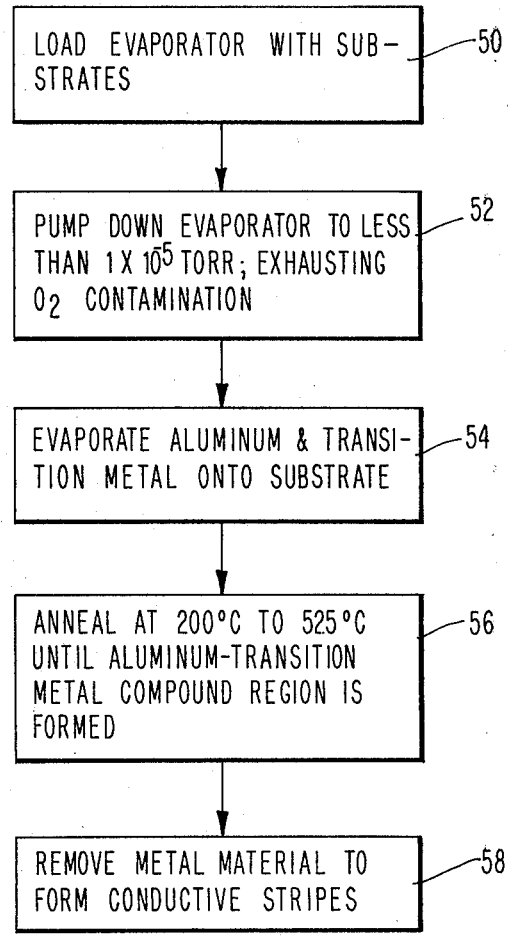
FIG. 4 is a flow diagram illustrating one preferred method for forming the conductive stripe of the present invention.

The method for forming the narrow intermetallic conductive stripes on the surface of a body such as a silicon wafer, garnet substrate or the like may be described with reference to FIG. 4. The conductive film may be deposited on any suitable self-supporting substrate or body. The substrate is loaded into a standard evaporator as indicated in Step 50. The evaporation system then is evacuated using a suitable vacuum pump for an extended period of time with particular emphasis to outgassing the walls of the evaporator to reduce all possible oxygen contamination during evaporation. Oxygen contamination in the conductive stripe can cause problems because oxidation of the aluminum layers or the transition metal can reduce the rate (or prevent) the formation of the compound, causing a reduction in the beneficial effect of the compound layer on electromigration. Metallic evaporation sources, aluminum or aluminum-copper and the transition metal, should be of high purity and of the order of 99.99+% pure. The evaporator is pumped down to $1 \times 10^{-5}$ torr as indicated in Step 52. Pressures higher than this are not satisfactory because oxide contamination, whereas pressures lower than this are desirable, preferably less than about $5 \times 10^{-6}$ torr.

The aluminum and transition metals are then evaporated onto the substrate as indicated in Step 54. It is preferred to have transition metal evaporated quite slowly to produce a very fine grain structure. The preferred rates for evaporation of transition metal is about 0.02 Angstroms per sec. to 20 Angstroms per sec. The preferred evaporation rate from the aluminum source is about 2 Angstroms per sec. to 60 Angstroms per sec. It is of course important to also have a fine aluminum grain structure because of improved stripe definition and because the rate of compound formation is increased when more grain boundaries are available for interdiffusion between aluminum and the transition metal.

The specific evaporation technique can be any suitable one including conventional e-beam and heated filament evaporation techniques. The evaporation is usually conducted without substrate heating.

The annealing step 56 requires a heating at a temperature of 200° C to 525° C until the aluminum-transition metal compound region is formed. This temperature and the time required varies depending upon the specific transition metal and the specific aluminum-transition metal intermetallic compound desired. The minimum temperature required to produce compound formation can be estimated from the melting point of the various phases. Our experiments have shown that compound formation starts at approximately one-third to one-fourth of the melting point. For example:

| Compound | Annealing Temperature (Approx. lowest Possible) | Melting Point |
| --- | --- | --- |
| CrAl$_7$ | 250° C – 300° C | 790° C |
| PdAl$_3$ | 200° C – 250° C | 785° C |
| PtAl$_4$ | 200° C – 250° C | 805° C |
| TiAL$_3$ | 375° C – 400° C | 1340° C |
| TaAl$_3$ | 400° C – 500° C | 1700° C |
| NbAl$_3$ (CbAl$_3$) | 400° C – 500° C | 1477° C |
| HfAl$_3$ | 350° C – 400° C | 1673° C |
| MoAl$_{12}$ | 200° C – 250° C | 706° C |
| Co$_4$Al$_{13}$ | 300° C – 400° C | 1130° C |
| NiAl$_3$ | 200° C – 300° C | 854° C |

To form an appreciable layer of compound requires knowledge of the activation energy for each compound (only CrAl$_7$ and TiAl$_3$ are known at this time). However, experiments have shown that 500 A transition layers can be completely converted to compound under these conditions:

| Transition Metal Layer | Compound | Annealing Temp. – Time |
| --- | --- | --- |
| 500A° Cr | CrAl$_7$ | 450° C – 3 hrs. |
| 500A° Cr | CrAl$_7$ | 400° C – 8 hrs. |
| 500A° Pt | PtAl$_4$ | 350° C – 4 hrs. |
| 500A° Pd | PdAl$_3$ | 400° C – 4 hrs. |
| 500A° Ti | TiAl$_3$ | 500° C – 6 hrs. |
| 500A° Ni | NiAl$_3$ | 400° C – 4 hrs. |

After the aluminum transition metal compound region is formed in the film, the personalization of the stripes is accomplished as indicated in Step 58. The stripe personalization is accomplished as indicated in Step 58 through typically depositing metal into electron beam defined patterns (electron beam lithography). The narrow stripes ($5 \times 10^{-5}$ inch wide) are formed by chemically removing (lift-off) the electron beam sensitive photoresist leaving the conductor line. Personalization of stripes of greater widths ($\geq 1 \times 10^{-4}$ inches) can frequently be accomplished using normal photoresist masking processes and etching if the compound layer is formed first through Step 56 before etching.

The following Examples are included merely to aid in the understanding of the invention and variations may be made by one skilled in the art without departing from the spirit and scope of the invention.

EXAMPLE 1

The substrate for film deposition were silicon wafers 6.35 centimeters wide. The wafers had a 5000 A coating of silicon dioxide thereon. The silicon wafers were put into the chamber of the evaporator. The evaporator was evacuated by use of a vacuum pump for 16 hours to outgas the walls to reduce oxygen contamination during the subsequent evaporation. The aluminum and chromium sources were degassed by evaporating onto a shutter. The pressure after the pumping for 16 hours was approximately $1 \times 10^{-6}$ torr. A liquid nitrogen shroud was used to drop the pressure to $2 \times 10^{-7}$ power torr. By outgassing chromium and aluminum onto the shutter, substantially all oxygen was gettered and ultimate pressure of $7 \times 10^{-8}$ torr was reached. An aluminum layer was evaporated using a heating filament at a rate of 33 Angstroms per sec. onto the silicon dioxide surface. The thickness of this aluminum film was 6000 Angstroms. Chromium was then evaporated using an e-beam directed onto the chromium source. Chromium was evaporated at 2 Angstroms per sec. and the thickness of the layer was 500 Angstroms. Another layer of aluminum was then evaporated on top of the chromium. This second layer was deposited at a rate of 33 Angstroms per sec. and was 6000 Angstroms thick. The resulting grain size of Cr was ~ 200 Angstroms and 3000–5000 Angstroms for Al. After the samples were cooled, the pressure was raised in the evaporator and the samples removed.

The aluminum-chromium-aluminum 6% Cu was evaporated onto test stripe photoresist pattern which contained 100 stripes per wafer. Test patterns (100 stripes 0.05–0.07 mils wide by 10 mils long with pad areas about 3 mils square) were formed with electron beam lithography using electron beams sensitive polymethylmethacrylate photoresist. The liftoff process was then completed by soaking wafers in acetone until the photoresist was stripped leaving the metal line patterns. The samples were then annealed at 400° for 3 hours. This had the effect of converting the chromium metal and the aluminum into the $CrAl_7$ compound. At that point 2 microns of sputtered quartz ($SiO_2$) were added on top. Via holes were etched using standard photoresist and etching techniques and chromium-gold pads were evaporated for contacts. The wafers were then diced and the dies mounted onto TO5 headers for testing.

The header mounted chips are mounted on the inside of Delta MK-2300 oven doors and electrically connected to a power supply and failure sensor circuit. The ambient temperature and desired current level (current density) for the electromigration test are controlled with feed-back circuits. A failure is recorded on a continuous strip chart; the test is continued until at least 50% of the stripes (12) have failed.

EXAMPLES 2-5

The process of Example 1 was followed to produce the aluminum or aluminum-copper stripe structure indicated in Table I. They are the prior art structures which are useful to compare the present invention. The Table I also includes the various process conditions, thicknesses of deposited metal and testing results for each of these narrow conductive stripes in each Example.

EXAMPLES 6-12

The process of Example was followed to produce the intermetallic compound aluminum stripe structure indicated in Table I. The Table I also includes the various process conditions, thicknesses of deposited metal and testing results for each of these narrow conductive stripes in each Example.

The lifetest data (Table I) shows that intermetallic layers of $CrAl_7$, $TiAl_3$ and $HfAl_3$ significantly improve for electromigration lifetime of Al-6% Cu conductor lines. The $CrAl_7$ and $TiAl_3$ compounds form more planar layers (see FIG. 3), whereas $HfAl_3$ forms along grain boundaries (FIG. 2). The Al-Cu stripes with a $TiAl_3$ layer in the center (Example 6, Table I) show an improvement of 27 times over the best data for Al-Cu (Example 4, Table I) and about 32 times improvement over the average (Example 3). When the Ti layer is increased to 500 A (as deposited) the test was interrupted because of a high resistance condition which the tester sensed as a failure (Example 5). However, the stripes were still continuous and no electromigration failure. The improvement was still a factor of 10 better than Al-Cu. The resistance of the $TiAl_3$ structure in Examples 5 and 6 was within 20% and 7% of the Al-Cu value. The lifetest data for the co-deposited Al-Cu-Ti (Example 7) demonstrates the effect of the barrier layer on void link-up, i.e. the improvement for $TiAl_3$ at grain boundaries was a factor of 5 (co-deposit film) as compared to 27 for the layered structure (Example 6).

The $CrAl_7$ data (Example 8) shows an improvement of 55 times over the best Al-Cu lifetest data when 500 A of Cr was deposited initially. The resistance of the $CrAl_7$ structure was within 10% of the Al-Cu stripes. It appears that the $CrAl_7$ layer represents the best combination of thick intermetallic layer to reduce Al electromigration and stop void propagation. The $HfAl_3$ lifetest data (Examples 9, 10) shows a factor of 18 improvement over the best Al-Cu data. The $HfAl_3$ structure may be more efficient in blocking Al movement down grain boundaries (see FIG. 2) but not as good as the $CrAl_7$ layered structure in stopping hole growth which controls the lifetime. The co-deposited Al-Co and Al-Cu-Co also show a factor of 3-5 improvement over the best Al-Cu data. However, these structures only restrict Table I Test Conditions: 250° C, 1 × 10⁶ amps/cm²

| Example | Thickness(A°) | Deposition Rate (A°/Sec) | Compound Formed | Wt. % Compound Per Stripe | Line Width (× 10⁻³in.) | Median Failure Time(hrs.) | Standard Deviation |
|---|---|---|---|---|---|---|---|
| 1. Al-6% Cu / Cr / Al-6% Cu | 6000 / 500 / 6000 | 33 / 2.0 / 33 | $CrAl_7$ | 10% | 7.5 | 11,000 | 0.8 |
| 2. Al | 12000 | 30 | — | — | 6.5 | 8.5 | 0.97 (aver.data) |
| 3. Al | 11900 | 30 | — | — | 7.4 | 33.5 | 0.79 (best data) |
| 4. Al-6% Cu | 12000 | 33 | — | — | 6.0 | 170 | 0.67 (aver.data) |
| 5. Al-6% Cu | 11500 | 33 | — | — | 6.0 | 200 | 0.55 (best data) |
| 6. Al-6%Cu / Ti / Al-6% Cu | 6000 / 500 / 6000 | 33 / 3.7 / 33 | $TiAl_3$ | 8% | 7.2 | 1942 | 0.1 (resistance failure) |
| 7. Al-6% Cu / Ti / Al-6% Cu | 6000 / 200 / 6000 | 33 / 3.7 / 33 | $TiAl_3$ | 6% | 7.6 | 5500 | 0.6 |
| 8. Al-6% Cu-Ti Co-deposit | 12000 (Al-Cu) / 200 (Ti) | 33 / 3.7 | $TiAl_3$ | 6% | 7.2 | 880 | 0.12 (resistance failure) |
| 9. Al-6% Cu / Hf / Al-6% Cu | 6000 / 500 / 6000 | 33 / 1.6 / 33 | $HfAl_3$ | 10% | 6.0 | 1000 | 0.1 (resistance failure) |
| 10. Al-6% Cu / Hf / Al-6% Cu | 6000 / 500 / 6000 | 33 / 1.6 / 33 | $HfAl_3$ | 10% | 6.0 | 3700 | 0.3 |
| 11. Al-6% Cu-Co Co-deposit | 12000 (Al-Cu) / 150 (Co) | 33 / 4 | $Co_4Al_{13}$ and/or $Co_2Al_9$ | 4% | 4.9 | 580 | 0.7 |
| 12. Al-Co | 12000 (Al) / 150 (Co) | 33 / 4 | $Co_4Al_{13}$ and/or $Co_2Al_9$ | 4% | 6.0 | 700 | 1.2 | mass transport of Al at grain boundaries (similar to Al-Cu-Ti co-deposit data) without reducing hole formation appreciably.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A current conductive stripe having minimum physical dimensions and being supported upon a substrate comprising:
   aluminum and at least one region within the aluminum stripe containing an intermetallic compound of aluminum and a transition metal.

2. A current conductive stripe of claim 1 wherein the minimum physical dimensions is less than about $6 \times 10^{-4}$ inches.

3. The conductive stripe of claim 1 wherein said intermetallic compound is between about 2 and 40 percent by weight.

4. The conductive stripe of claim 1 wherein said transition metal is chromium and the said compound is $CrAl_7$.

5. The conductive stripe of claim 1 wherein said transition metal is hafnium and the said compound is $HfAl_3$.

6. The conductive stripe of claim 4 wherein said intermetallic compound is between about 2 and 40 percent by weight of the stripe.

7. The conductive stripe of claim 5 wherein said intermetallic compound is between about 2 and 25 percent by weight of the stripe.

8. The conductive stripe of claim 1 wherein one said region is located near the center of the thickness of said stripe.

9. The conductive stripe of claim 1 wherein one said region is located near the bottom of the thickness of said stripe.

10. The conductive stripe of claim 1 wherein the said substrate upon which it is supported includes a magnetic material capable of forming magnetic bubbles therein.

11. The conductive stripe of claim 1 wherein the said substrate upon which it is supported includes semiconductor devices.

12. An integrated circuit structure comprising a plurality of semiconductor devices electrically connected by means of current conductive stripes which have a minimum physical dimension of less than about $6 \times 10^{-4}$ inch, said stripes being composed of aluminum and at least one region within the aluminum stripe containing an intermetallic compound of aluminum and a transition metal.

13. The integrated circuit structure of claim 12 wherein said structure is composed of silicon.

14. The integrated circuit structure of claim 12 wherein the transition metal is chromium and the aluminum chromium compound is between about 2 and 40 percent by weight of the stripe.

15. The integrated circuit structure comprising a plurality of semiconductor devices electrically connected by means of current conductive stripes which have a minimum physical dimension of less than about $6 \times 10^{-4}$ inch, said stripes being composed of aluminum and at least one region within the aluminum stripe containing an intermetallic compound of hafnium and aluminum.

16. The integrated circuit structure of claim 15 wherein one said region is located near the center of the thickness of said stripe.

17. The integrated circuit structure of claim 15 wherein one said region is located near the bottom of the thickness of said stripe.

* * * * *